US012735804B2

(12) United States Patent
Andreaco et al.

(10) Patent No.: US 12,735,804 B2
(45) Date of Patent: Sep. 15, 2026

(54) CERAMIC SUPPORT PLATE

(71) Applicant: Siemens Medical Solutions USA. Inc., Malvern, PA (US)

(72) Inventors: Mark Andreaco, Knoxville, TN (US); Troy Marlar, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 339 days.

(21) Appl. No.: 18/582,981

(22) Filed: Feb. 21, 2024

(65) Prior Publication Data

US 2025/0263863 A1 Aug. 21, 2025

(51) Int. Cl.

*C30B 15/10* (2006.01)
*C30B 15/14* (2006.01)
*C30B 29/28* (2006.01)
*C30B 29/34* (2006.01)

(52) U.S. Cl.

CPC .............. *C30B 15/10* (2013.01); *C30B 15/14* (2013.01); *C30B 29/28* (2013.01); *C30B 29/34* (2013.01)

(58) Field of Classification Search

CPC ......... C30B 15/10; C30B 15/14; C30B 29/28; C30B 29/34; Y10T 117/1032

See application file for complete search history.

(56) References Cited

U.S. PATENT DOCUMENTS 6,278,832 B1 8/2001 Zagumennyi et al.
9,809,900 B2 11/2017 Andreaco et al.
10,844,514 B1 11/2020 Wang et al.
10,995,102 B2 5/2021 Wang et al.
11,136,690 B1 10/2021 Wang et al.
11,155,930 B2 10/2021 Wang et al.
11,198,947 B2 12/2021 Wang et al.
11,254,868 B2 2/2022 Wang et al.
11,566,341 B2 1/2023 Wang et al.
11,566,342 B2 1/2023 Wang et al.
11,566,343 B2 1/2023 Wang et al.
11,572,634 B2 2/2023 Wang et al.
11,828,001 B2 11/2023 Wang et al.
11,851,782 B2 12/2023 Wang et al.
11,851,783 B2 12/2023 Wang et al.
11,885,037 B2 1/2024 Wang et al.
2013/0087094 A1 4/2013 Quinton et al.
2014/0061537 A1 3/2014 Zagumennyi et al.
2021/0198571 A1 7/2021 Wang et al.
2022/0220630 A1 7/2022 Wang et al.
(Continued)

FOREIGN PATENT DOCUMENTS

CN 101831692 A 9/2010
CN 103374753 A 10/2013
CN 105926038 A 9/2016
(Continued)

*Primary Examiner* — Robert M Kunemund

(57) ABSTRACT

Disclosed herein is a device for manufacturing a single crystal comprising: a furnace that includes a furnace wall; a crucible disposed on a first base plate within the furnace; where the first base plate has a porosity of 1 to 80 volume percent, based on a total volume of the first base plate; and where the first base plate does not comprise free flowing particles; an induction coil disposed inside the furnace wall and outside the crucible; and a refractory lining being disposed in an annulus between the furnace wall and the crucible.

19 Claims, 3 Drawing Sheets

(56) References Cited

U.S. PATENT DOCUMENTS

| | | | |
|---|---|---|---|
| 2023/0295834 A1 | | 9/2023 | Wang et al. |

FOREIGN PATENT DOCUMENTS

| | | | | |
|---|---|---|---|---|
| CN | 206319080 | U | | 7/2017 |
| CN | 111501096 | A | | 8/2020 |
| CN | 111575784 | A | | 8/2020 |
| CN | 111826708 | A | | 10/2020 |
| CN | 112520437 | A | | 3/2021 |
| CN | 113480198 | A | | 10/2021 |
| CN | 113930838 | A | | 1/2022 |
| CN | 114808109 | A | | 7/2022 |
| CN | 115012038 | A | | 9/2022 |
| CN | 115044964 | A | | 9/2022 |
| CN | 115573041 | A | | 1/2023 |
| CN | 116377585 | A | | 7/2023 |
| JP | 2019202923 | A | * | 11/2019 |
| TW | I546429 | A | | 8/2016 |
| WO | 2005042812 | A1 | | 5/2005 |
| WO | 2021031139 | A1 | | 2/2021 |
| WO | 2021031140 | A1 | | 2/2021 |
| WO | 2021031142 | A1 | | 2/2021 |

* cited by examiner

CERAMIC SUPPORT PLATE

BACKGROUND

This disclosure relates to a ceramic plate for supporting a crucible in a furnace. More specifically, this disclosure relates to a ceramic plate that is used for supporting a crucible that contains a melt from which high temperature materials are manufactured.

During the manufacturing of a crystal boule in a furnace, the crucible is heated by inductive heating using inductive coils that are located outside the outer tube. During this process, the raw materials in powder form are located in the crucible and are melted in a processing atmosphere (typically an inert gas) to prevent oxidation during the growth and cooling stages.

The crucible is typically manufactured from a noble metal. The crucible is supported by or in contact with refractory materials of any configuration. For example, the refractory materials may be ceramic-ceramic composite materials of any shape, such as cylinders, plates, sheets, fabrics, spheres, fragments, and the like. They may be solid or hollow beads of various surface areas. The chemical compositions of the refractory materials include ceramics that include, but are not limited to silica, alumina, magnesium oxide, calcium oxide, calcium silicates, hafnium oxide, zirconium oxide in any combination and form. Depending on the furnace design, refractory placement, the growth atmosphere selected, the composition of the crucible material and the composition of raw materials from which the single crystal is to be grown, oxidation of the crucible may occur. Points of contact between the refractory materials and the crucible results in the noble metals (used in the crucible) diffusing into the refractory materials. Local evaporation of the noble metal due to oxidation of the crucible may also occur. This produces a loss of the noble metal (which is expensive) and increases the costs of manufacturing the single crystals. It is therefore desirable to minimize the loss of metal from the crucible and to reduce the costs of manufacturing the single crystals.

SUMMARY

Disclosed herein is a device for manufacturing a single crystal comprising a furnace that includes a furnace wall; a crucible disposed on a first base plate within the furnace; where the first base plate has a porosity of 1 to 80 volume percent, based on a total volume of the first base plate; and where the first base plate does not comprise free flowing particles; an induction coil disposed inside the furnace wall and outside the crucible; and a refractory lining being disposed in an annulus between the furnace wall and the crucible.

Disclosed herein is a method of growing a high temperature material, comprising disposing a melt within a crucible in a furnace; where the furnace includes a furnace wall; an induction coil disposed in an annulus between the crucible and the furnace wall; where the crucible is disposed on a first base plate within the furnace; where the first base plate has a porosity of 1 to 80 volume percent, based on a total volume of the first base plate; and where the first base plate does not comprise free flowing particles; and drawing a boule from the melt within the crucible to grow the high temperature material.

DETAILED DESCRIPTION

Disclosed herein is a ceramic-ceramic composite base plate that is disposed beneath the crucible in a furnace. The base plate supports the crucible and isolates it from the 'bubble grog ceramics' that can become imbedded in the crucible during a crystal growth heat cycle. At least one surface (e.g., an upper surface of the base plate) contacts the bottom outer surface of the crucible. The upper surface of the base plate comprises a plurality of ridges and channels, which alternate with each other. The upper surface of the ridges contacts the bottom surface of the crucible and establishes contact points between the two surfaces. Disclosed herein too is a device that uses the base plate during the manufacture of a single crystal boule.

The crystalline boules may be single crystal boules, with dopant activators to form a scintillating material, that may also contain co-dopants to enhance the scintillator performance characteristics and/or improve mechanical/physical properties. In an embodiment, the crystal boules may comprise high temperature materials that are not oxides crystals or oxide scintillators.

Examples of such scintillators are, but are not limited to: lutetium oxy-orthosilicates (LSO's), lutetium yttrium oxy-orthosilicates (LYSO's), gadolinium oxy-orthosilicates (GSO's), gadolinium aluminum gallium garnets (GAGG's), gadolinium-gallium-aluminum garnet (GGAG's), gadolinium-yttrium-gallium-aluminum garnet (GYGAG's), gadolinium-lutetium-gallium-aluminum garnet (GLuGAG's), gadolinium-scandium-gallium garnet (GSGG's), gadolinium-yttrium-aluminum garnet (GYAG's), gadolinium-scandium-aluminum garnet (GSAG's), gadolinium-gallium garnet (GGG's) or gadolinium-yttrium-scandium-aluminum garnet (GYSAG's).

Figure 1:
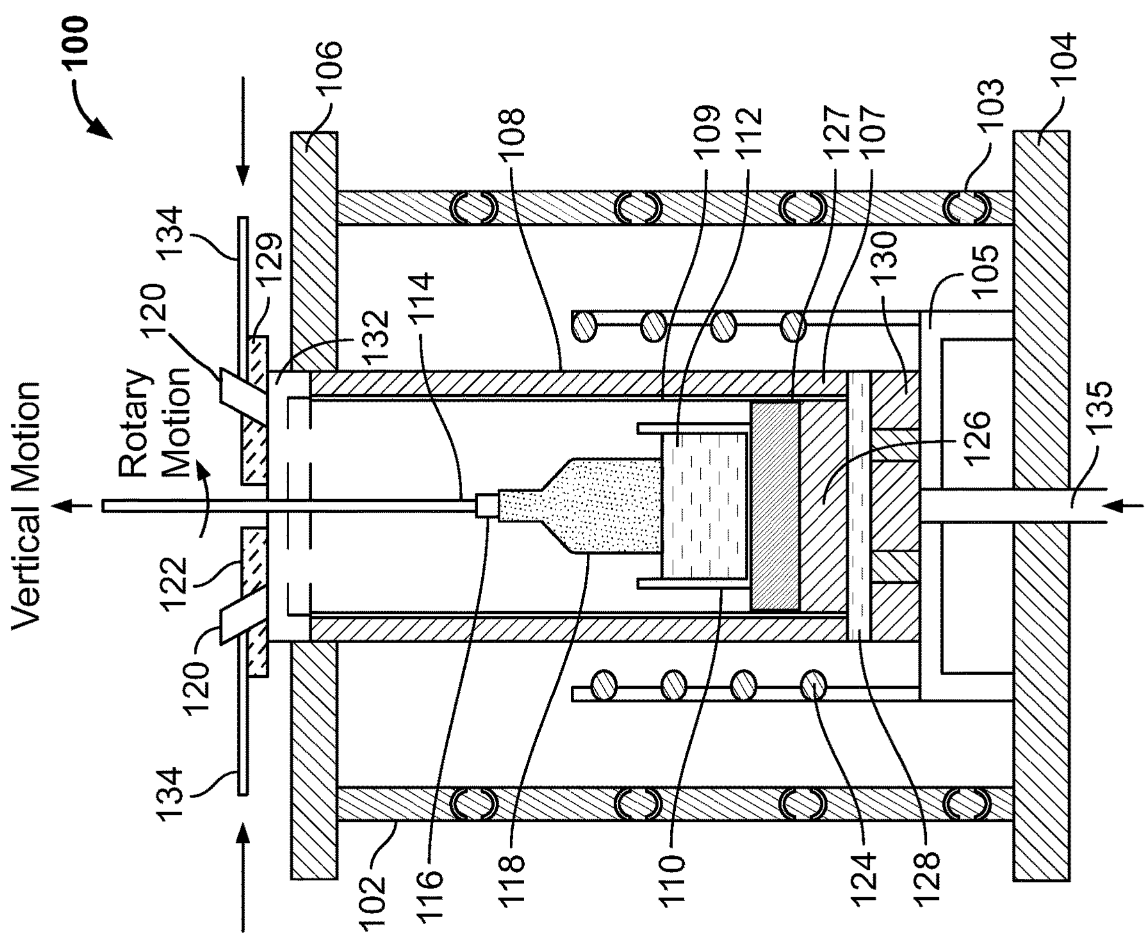
FIG. 1 is a schematic depiction of an exemplary device that is used to produce a crystalline boule.

FIG. 1 depicts device 100 that is used to produce a crystalline boule. The device 100 comprises a furnace 102 that contains cooling tubes 103 disposed in its walls. Alternatively, the cooling coils may be located outside the walls of the furnace. Fluid flowing through the cooling tubes 103 can be used to extract heat from the furnace. The furnace 102 is mounted on a base surface 104 and has a furnace cover 106 disposed on an end opposite the base surface 104. The base surface 104 may contain channels that can be used to locate induction coils (not shown), coils for carrying a cooling fluids (not shown) or components that can facilitate mechanical movement (not shown). Disposed in the furnace is a growth chamber 108 in which is disposed a crucible 110.

Noble metals and suitable alloys of noble metals may be used to manufacture the crucible. The crucible is typically manufactured from a noble metal such as ruthenium (Ru), rhodium (Rh), palladium (Pd), silver (Ag), osmium (Os), iridium (Ir), platinum (Pt), gold (Ag), or a combination thereof. Iridium is commonly used in crucibles that are used to manufacture scintillator single crystals or other high temperature materials that are not oxides or are not used for scintillation.

Disposed upon the base surface 104 is a base frame 105 upon which is located the growth chamber 108. A conduit 135 that functions as an inlet for a first growth gas stream is disposed in the base surface 104 and the base frame 105. The growth atmosphere (formed by the first growth gas stream) is crystal composition and crucible composition dependent.

The growth atmosphere may be reducing when using hydrogen gas, slightly reducing when using nitrogen gas, oxidizing when using air, $CO_2$, nitrogen mixed with air or oxygen, or any noble gas mixed with air or $O_2$. The growth chamber 108 protrudes through an opening in the furnace cover 106. The furnace cover 106 may contain internal cooling coils (not shown) through which a cooling fluid is discharged. The crucible 100 contains a melt 112 that is obtained from melting raw materials. A pull rod 114 having a seed crystal 116 disposed at its lower end is dipped into the melt 112 and then slowly moved away from the melt (moved vertically) while undergoing rotary motion. The rotary motion either clockwise or counterclockwise is used to control the interface shape of the boule while it is in the melt. The translation motion is used to control the pull rate of the boule by extracting the boule from the melt under a controlled translation rate. The translational motion refers to the linear movement of the pull rod (or boule) either upward or downward, which controls the rate at which the boule is extracted from the melt. This means that the pull rod moves vertically in a straight line to pull the crystal boule 118 out of the melt at a controlled speed.

A crystal boule is a single-crystal ingot produced by using a seed crystal to create a larger crystal, or ingot. This seed crystal is dipped into the molten raw material and slowly extracted. The melt grows on the seed crystal in a crystalline fashion. As the seed is extracted, the melt solidifies and eventually a large, cylindrical crystal boule is produced.

The growth chamber 108 contains an outer tube 107, an inner tube 109, a growth chamber bottom plate 128 and a growth chamber outer top plate 129. The outer tube 107 and inner tube 109 are disposed between the growth chamber bottom plate 128 and the growth chamber outer top plate 129. The growth chamber outer top plate 129 may be disposed on a growth chamber inner top plate 132. The growth chamber inner top plate 132 contacts the upper portion of the outer tube 107. The outer tube 107 is typically manufactured from quartz, while the inner tube 109 is typically manufactured from zirconia. A first O-ring seal (not shown) may be disposed between the outer tube 107 and the growth chamber bottom plate 128. A second O-ring (not shown) is disposed between the outer tube 107 and the growth chamber inner top plate 132. Disposed between the growth chamber bottom plate 128 and the crucible 110 is a first base plate 127 that is the subject of this disclosure. In an embodiment, the first base plate 127 contacts the bottom of the crucible 110. The first base plate 127 replaces either all or a portion of the beads 126 that are typically located between the growth chamber bottom plate 128 and the bottom of the crucible 110.

Disposed beneath the growth chamber bottom plate 128 and the base surface 104 of the furnace is a porous frit 130 that comprises granules or briquettes of a heat resistant material. The porous frit 130 can also permit an inert gas to pass through it.

The upper plate 129 contain two inlet ports 134 (that contact two eyepieces 120) through which a second growth gas stream may be introduced to surround the crystal boule and the melt in the crucible 110. The second growth gas stream may be the same as the first growth gas stream (which is described above). The eyepieces 120 may contain lenses (not shown) through which the activity in the growth chamber 108 may be viewed.

Disposed between the furnace 102 and the growth chamber 108 are induction coils 124. The induction coils 124 (also referred to as radio-frequency (RF) coils) are used to heat the crucible and its contents and to produce the melt from which the crystal boule is manufactured. The growth chamber 108 can be moved vertically (up and down) or kept stationary with respect to the induction coils 124.

It is to be noted in the FIG. 1 that the growth chamber bottom plate 128 and the growth chamber upper plate 129 may also contain cooling coils (not shown) through which a cooling fluid is transported.

Figure 2:
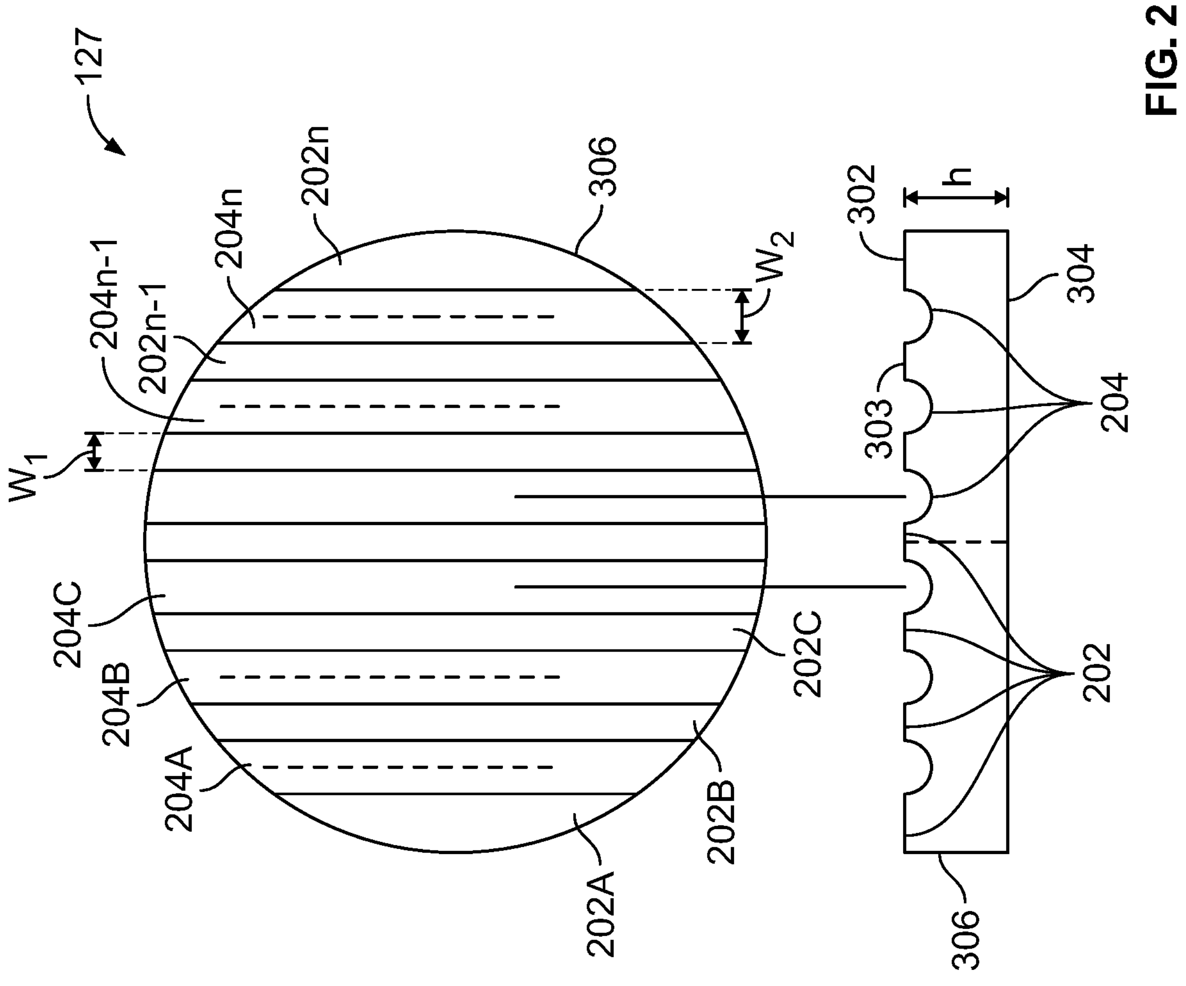
FIG. 2 is a schematic depiction of an exemplary monolithic base plate.

FIG. 2 is a schematic depiction of an exemplary base plate 127 that may be used in the furnace 100 of FIG. 1. FIG. 2 is a depiction of the base plate 127, which as noted above comprises a plurality of alternating ridges 202A, 202B, 202C, . . . 202*n* and channels 204A, 204B, 204C, . . . , 204*n* on at least one surface. The base plate 127 comprises two opposing surfaces—a first surface 302 and a second surface 304, portions of which are parallel to each other. The outer perimeter 306 of the base plate 127 may have any geometry. It may be circular, square, rectangular, triangular, elliptical, or may include a combination of such geometries. In an embodiment, the outer perimeter 306 of the first base plate has the same geometry as the outer surface of the crucible. In a preferred embodiment, the outer perimeter 306 of the base plate 127 is circular.

The radius of the base plate may be 50 to 150% of a radius of the crucible. In a preferred embodiment, the radius of the base plate 127 (having a circular outer perimeter 306) may vary between 5 to 75 centimeters, preferably 10 to 70 centimeters, and more preferably 15 to 60 centimeters.

At least one of these surfaces is textured to contain the plurality of alternating ridges 202A, 202B, 202C, . . . , 202*n* and channels 204A, 204B, 204C, . . . , 204*n*. In an embodiment, the ridges and channels extend across at least one surface of the base plate 127. In an embodiment, the ridges and channels extend across both opposing surfaces 302 and 304 of the base plate 127. Ridges and channels on the surface 304 (that does not contact the crucible) are optional. The ridges transfer heat to the crucible while reducing (preferably minimizing) the amount of contact between the crucible 110 and the base plate 127. The base plate 127 has a thickness "h" of 1 centimeter to about 10 centimeters, preferably 1.5 centimeters to 5 centimeters. The channels protrude into the thickness of the base plate 127 from the surface 302 or optionally from the surface 304. The channels may facilitate the movement of inert gases (that are introduced into the furnace) across the base plate 127. Inert gases are circulated in the furnace to prevent oxidation of the crystal boule.

The longitudinal edges of the ridges are parallel to each other and extend across an entire surface 302 of the base plate 127. Each ridge 202A through 202*n* (except for an outermost ridge) has two channels 204—one on each side of the respective ridge and each channel 204A, 204B, 204C, 204D, . . . , 204*n* (except for an outermost channel) has two ridges-one on each side of the respective channel. The upper surface 303 of the ridges 202A, 202B, 202C, . . . , 202*n* are generally parallel to the bottom surface 306 of the base plate 127.

The width of the ridges is designed to minimize the surface area contact of the base plate with the crucible while providing sufficient mechanical integrity to support the weight of the crucible and its melt/solidified contents. In an embodiment, each ridge 202A, 202B, 202C, . . . , 202*n* has an upper surface having a width $w_1$ of 0.2 to 40 millimeters, preferably 0.4 to 20 millimeters. The width $w_2$ of each channel 204A, 204B, 204C, 204D, . . . , 204*n* is greater than the width w of each ridge 202A, 202B, 202C, . . . , 202*n*. In another embodiment, the width of the each of the channels is less than or equal to that of each of the ridges. The channels 204A, 204B, 204C, 204D, . . . , 204$n$ formed in the upper surface of the base plate 127 preferably have an outer perimeter that may be semi-circular, rectangular or square-wave like, saw-tooth like, or a combination thereof. The inner perimeter of the channels may have no internal angle or may have an interior angle that varies from 1 degree to 189 degrees. The interior angle of the inner perimeter may be 30 to 120 degrees, 40 to 110 degrees, 60 to 90 degrees, and so on.

In a preferred embodiment, each of the channels 204A, 204B, 204C, 204D, . . . , 204$n$ of the base plate have a perimeter that is semi-circular of a radius of 0.5 to 60 millimeters, preferably 1 to 30 millimeters. It is to be noted that each of the channels may have an outer perimeter or shape that is different from each other. In an embodiment, some of the channels may have an outer perimeter that has a different shape from some of the other channels.

The base plate 127 is generally manufactured from a ceramic and has a melting point that is greater than the melting point of the crystalline boule. The base plate 127 may be manufactured from a metal oxide. Suitable metal oxides are silica, alumina, magnesium oxide, calcium oxide, calcium silicates, hafnium oxide, zirconia, MCrAlY (where M is either iron, nickel or cobalt, Cris chromium, Al is aluminum and Y is yttrium), or a combination thereof. In a preferred embodiment, the base plate 127 comprises zirconia, alumina, or a combination thereof.

In an embodiment, the base plate 127 is never composed of loose free-flowing particles or beads. The first base plate may either be in the form of a solid plate (a plate with minimal porosity of about 1 to 5 volume percent) or may be in the form of a porous solid (with a porosity of up to 80 volume percent, where the particulates that make up the plate are fused together and are not free flowing). In an embodiment, the base plate 127 is in the form of a single monolithic solid piece (i.e., it is in the form of a single non-divisible solid that if divided would be damaged). The base plate 127 may be monolithic and yet have a porosity in an amount of 1 to 80 volume percent, 2 to 70 volume percent, 3 to 60 volume percent, based on a total volume of the base plate. In an embodiment, the base plate 127 may have a porosity of 60 to 80 volume percent, based on a total volume of the base plate. In other words, the base plate 127 can contain a plurality of particles that are fused together to form a single piece, thus giving the base plate 127 its porosity. Inert gases may be circulated in the furnace through the porous base plate.

Figure 3:
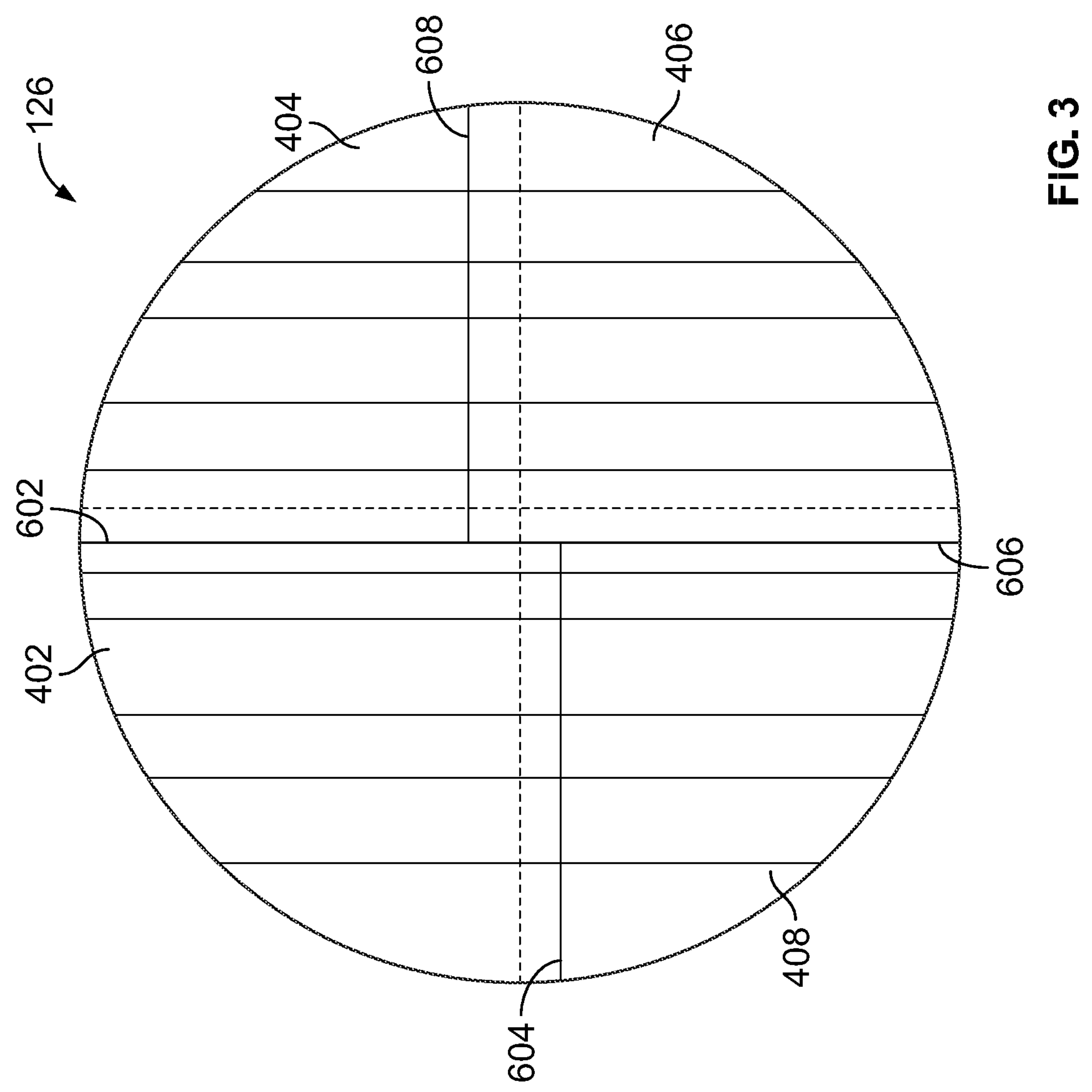
FIG. 3 is a schematic depiction of an exemplary base plate that comprises 4 monolithic pieces.

In another embodiment, the base plate 127 may comprise a plurality of separate monolithic parts that can be physically co-located together to form the respective base plate. In an embodiment, 2 to 6 separate monolithic parts (not shown) may be physically co-located together to form the base plate 127. Each monolithic part can be co-located with a neighboring part using a dove tail joint, a butt joint, a mitered joint, a half-lap joint, a tongue and groove joint, a mortise and tenon joint, or a combination thereof. The FIG. 3 depicts a 4 piece base plate 127 having 4 sections 402, 404, 406 and 408 each of which is separately manufactured with a tongue and groove joint or half-lap joint indicated by lines 602, 604, 606 and 608.

In an embodiment, the base plate is manufactured by a variety of different methods. In an embodiment, the base plate may be manufactured by mixing a slurry of the desired components of the refractory material in the proper ratios then pouring into molds followed by drying and calcination. The calcined product is then sintered to achieve the final desired product. Uniaxial or isostatic pressing may also be used at some point during the process. The slurry may comprise aluminum oxide, zirconium oxide, or a powder that comprises MCrAlY (where M is either iron, nickel or cobalt, Cris chromium, Al is aluminum and Y is yttrium), and the like.

As noted above, a solid base plate with ridges and channels such as those detailed above may be used to support the crucible during the manufacturing of a crystalline boule, while at the same time minimizing the loss of noble metals, especially iridium, which is frequently used as the crucible material.

While the invention has been described with reference to some embodiments, it will be understood by those skilled in the art that various changes may be made and equivalents may be substituted for elements thereof without departing from the scope of the invention. In addition, many modifications may be made to adapt a particular situation or material to the teachings of the invention without departing from essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. A device for manufacturing a single crystal comprising:
- a furnace that includes a furnace wall;
- a crucible disposed on a first base plate within the furnace; where a surface of the first base plate contacts a bottom surface of the crucible and where the surface of the first base plate that contacts the bottom surface of the crucible comprises ridges and channels;
- an induction coil disposed inside the furnace wall and outside the crucible; and
- a refractory lining being disposed in an annulus between the furnace wall and the crucible.

2. The device of claim 1, where the first base plate is a monolith.

3. The device of claim 1, where the width of the channels is greater than that of the ridges.

4. The device of claim 1, where the width of the channels is less than or equal to that of the ridges.

5. The device of claim 1, where the channels facilitate transport of inert gases in the furnace.

6. The device of claim 1, where the ridges and channels extend across an entire surface of the base plate and where the ridges and the channels are parallel to each other.

7. The device of claim 1, where the first base plate comprises alumina, zirconia, MCrAlY, or a combination thereof; where M is either iron, nickel or cobalt, Cr is chromium, Al is aluminum and Y is yttrium.

8. The device of claim 1, where the first base plate has a porosity of 1 to 5 volume percent, based on a total volume of the first base plate.

9. The device of claim 1, where the first base plate has a porosity of 60 to 80 volume percent, based on a total volume of the first base plate.

10. The device of claim 1, further comprising an outer tube that lies within the furnace such that the induction coil is located in an annulus between the furnace wall and the outer tube.

11. The device of claim 1, where the first base plate has a radius of 50 to 150% of a radius of the crucible.

12. The device of claim 1, where an outer perimeter of the first base plate has a same geometry as an outer surface of the crucible.

13. A method of growing a high temperature material, comprising:

disposing a melt within a crucible in a furnace; where the furnace includes:

a furnace wall;

an induction coil disposed in an annulus between the crucible and the furnace wall;

where the crucible is disposed on a first base plate within the furnace, further comprising contacting a bottom surface of the crucible to a surface of the first base plate, the surface of the first base plate that contacts the bottom surface of the crucible comprising ridges and channels; and drawing a boule from the melt within the crucible to grow the high temperature material.

14. The method of claim 13, where the first base plate is a monolith.

15. The method of claim 13, further comprising discharging an inert gas into the furnace, where the inert gas is transported across the base plate via the channels.

16. The method of claim 13, further comprising discharging an inert gas into the furnace via pores in the base plate.

17. The method of claim 13, wherein the high temperature material comprises lutetium oxy-orthosilicates, lutetium yttrium oxy-orthosilicates, gadolinium oxy-orthosilicates, gadolinium aluminum gallium garnets, gadolinium-gallium-aluminum garnet, gadolinium-yttrium-gallium-aluminum garnet, gadolinium-lutetium-gallium-aluminum garnet, gadolinium-scandium-gallium garnet, gadolinium-yttrium-aluminum garnet, gadolinium-scandium-aluminum garnet, gadolinium-gallium garnet or gadolinium-yttrium-scandium-aluminum garnet.

18. The device of claim 1, where the first base plate has a porosity of 1 to 80 volume percent, based on a total volume of the first base plate; and where the first base plate does not comprise free flowing particles.

19. The method of claim 13 where the first base plate has a porosity of 1 to 80 volume percent, based on a total volume of the first base plate; and where the first base plate does not comprise free flowing particles.

* * * * *